United States Patent [19]

Hatakeyama et al.

[11] Patent Number: 4,538,151
[45] Date of Patent: Aug. 27, 1985

[54] ELECTRO-MAGNETIC WAVE ABSORBING MATERIAL

[75] Inventors: Kenichi Hatakeyama; Tetsuji Inui, both of Tokyo, Japan

[73] Assignee: Nippon Electric Co., Ltd., Tokyo, Japan

[21] Appl. No.: 478,914

[22] Filed: Mar. 25, 1983

[30] Foreign Application Priority Data

Mar. 31, 1982 [JP] Japan .................................. 57-52610
Apr. 5, 1982 [JP] Japan .................................. 57-56175

[51] Int. Cl.³ ............................ G01S 7/36; B22F 3/00
[52] U.S. Cl. ............................... 343/18 A; 252/62.55; 252/62.57
[58] Field of Search ..................... 343/18 A, 18 R; 252/62.55, 62.57

[56] References Cited

U.S. PATENT DOCUMENTS

| | | | |
|---|---|---|---|
| 3,737,903 | 6/1973 | Suetake et al. | 343/18 A |
| 3,996,167 | 12/1976 | Brown | 252/513 |
| 4,051,097 | 9/1977 | Aldrich | 106/36 X |
| 4,104,900 | 8/1978 | Nels | 72/70 |
| 4,173,018 | 10/1979 | Dawson et al. | 343/18 A |
| 4,280,935 | 7/1981 | Ogiwara | 106/36 X |

FOREIGN PATENT DOCUMENTS

| | | | |
|---|---|---|---|
| 90482 | 10/1983 | European Pat. Off. | |
| 116801 | 9/1979 | Japan | 343/18 A |
| 36987 | 3/1980 | Japan | |
| 99800 | 7/1980 | Japan | |
| 65754 | 10/1983 | Japan | |
| 611742 | 11/1948 | United Kingdom | 343/18 A |

*Primary Examiner*—Teddy S. Gron
*Assistant Examiner*—T. J. Wallen
*Attorney, Agent, or Firm*—Charles E. Pfund

[57] ABSTRACT

An electro-magnetic wave absorbing member comprises a mixture of short fibers of metal or alloy having a high electroconductivity, a length of from 0.1 mm to 50 mm and a length to diameter ratio of larger than 10, ferrite and a high molecular weight synthetic resin. In a modification a sheet of this material is used as a low input impedance layer and laminated with an electroconductive sheet and an impedance conversion layer. The member of this invention can increase electrical loss contributing to the absorption of electric magnetic wave, can stably control the absorption and can be used in many applications.

6 Claims, 15 Drawing Figures

ELECTRO-MAGNETIC WAVE ABSORBING MATERIAL

BACKGROUND OF THE INVENTION

This invention relates to electro-magnetic wave absorbing material.

Such material is used for preventing ghosts of iron towers, ships, etc. in radar systems, and for preventing generation of unwanted electric wave and dispersion thereof.

As disclosed in Japanese Laid Open Patent Specification No. 36987/1980, a prior art electro-magnetic wave absorbing material was constituted by a mixture of ferrite, carbon black and a high molecular weight synthetic resin. Such material absorbs electro-magnetic wave energy by the magnetic loss caused by ferrite and electric loss caused by carbon black. Accordingly such electro-magnetic wave absorbing material is coated or deposited on the surface of a metal or electro-conductive sheet to a specific thickness so as to form an electro-magnetic wave absorber.

The capability of absorbing electric wave of such absorber, however, differs depending upon the frequency and intensity of the electric wave to be absorbed so that it has been desired to provide improved electro-magnetic wave absorbing material or member having a high absorbing efficiency.

In order to increase the loss of the electro-magnetic wave imparted by the absorbing material described above, it is necessary to increase the quantities of incorporation of ferrite and carbon. However, even when the quantity of ferrite is increased there is a limit for the magnetic loss, while carbon black can increase electric loss, its function becomes unstable due to variations in electric conductivity and particle size.

As is well known in the art, the electro-magnetic wave absorption capability of the electric wave absorbing member described above has the maximum absorption efficiency when the input impedance Z as measured from the surface of a layer of the electro-magnetic wave absorption material is unity, where $$Z = \sqrt{\frac{\mu_2}{\epsilon_2}} \tanh\left(j\frac{2\pi}{\lambda} \sqrt{\epsilon_2\mu_2}\, d\right)$$

where $\epsilon_2$ represents a complex dielectric constant of the absorption layer, $\mu_2$ a complex permeability, $\lambda$ wavelength and d the thickness of the absorption layer.

However, the frequency bandwidth in which a condition $Z=1$ holds is very narrow. For this reason, it has been difficult to obtain satisfactory electro-magnetic wave absorption characteristic over a wide frequency bandwidth.

SUMMARY OF THE INVENTION

Accordingly, a principal object of this invention is to provide novel electro-magnetic wave absorbing material and an electro-magnetic wave absorbing body utilizing the same that can increase electric loss contributing to the absorption of electro-magnetic wave, can stably control the loss and can widen the field of use of such material and body.

Another object of this invention is to provide a novel electro-magnetic wave absorbing body capable of efficiently absorbing electro-magetic wave over a wide frequency range.

According to one aspect of this invention, there is provided an electro-magnetic wave absorbing material comprising a mixture of short fibers of metal or alloy having a high electric conductivity, a length of from 0.1 mm to 50 mm and a length to diameter ratio of larger than 10, a ferromagnetic material and a high molecular synthetic resin.

According to another aspect of this invention, there is provided an electro-magnetic wave absorbing body comprising an electro-conductive base, a low input impedance layer disposed on the base, and an impedance transforming layer disposed on the low input impedance layer, the low input impedance layer consisting of a mixture of short fibers of metal or alloy having a high electric conductivity, a length of from 0.1 to 50 mm and a length to diameter ratio of larger than 10, a ferromagnetic material and a high molecular synthetic resin.

DESCRIPTION OF THE PREFERRED EMBODIMENT

Figure 1:
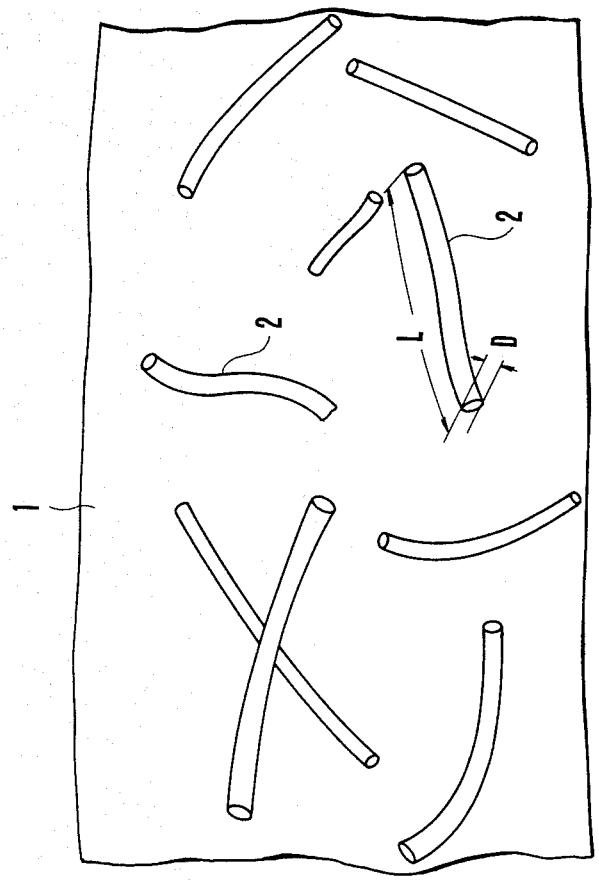
FIG. 1 is a diagrammatic representation showing the construction of the electro-magnetic wave absorbing material of this invention.

In a preferred embodiment shown in FIG. 1, into a mixture 1 of ferrite and a high molecular synthetic resin or a mixture of ferrite, a high molecular synthetic resin and carbon black is incorporated short fibers 2 of metal. Preferably each of the metal fibers 2 have a length (L) of 0.1–50 mm, and a length (L) to diameter (D) ratio L/D of larger than 10. The quantity of the metal fibers 2 to be incorporated should be larger than 3% by weight. The metal should have a high electric conductivity, such as Au, Ag, Cu, Al, Zn, Ni, Fe or alloys thereof. The ferrite may be also substituted by a ferromagnetic material such as iron, cobalt and nickel.

The electric wave characteristic of the electro-magnetic wave absorbing material of this invention will be described as follows.

Figure 2:
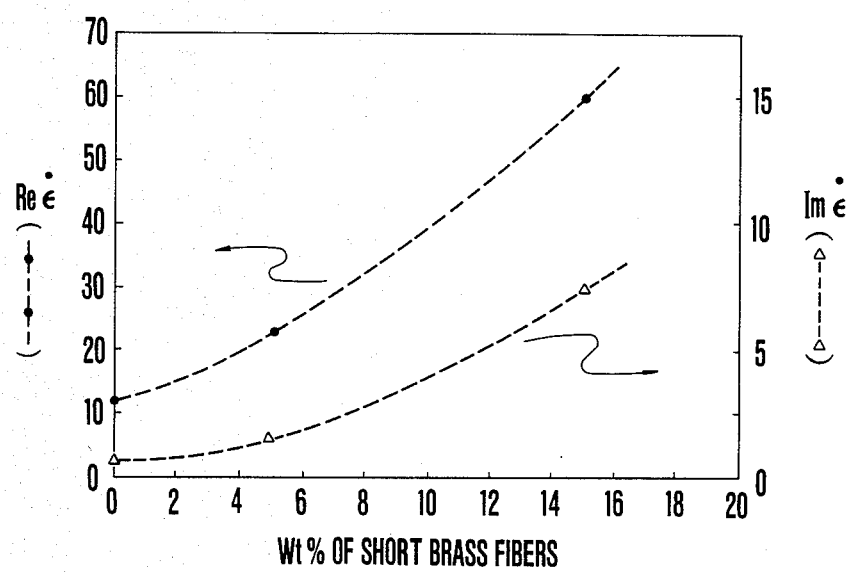
FIG. 2 is a graph showing the relationship among the quantity of short brass fibers, a real part (Re($\epsilon$)) and an imaginary part (Im($\epsilon$)) of the complex dielectric constant.

FIG. 2 shows complex dielectric $[\epsilon = \text{Re}(\epsilon) - j\,\text{Im}(\epsilon)]$ of a composition comprising epoxide resin, iron ferrite ($Fe_3O_4$) and short fibers of brass measured at a frequency of 9.4 GHz. Each of short brass fibers have a length L of about 2 mm, a diameter (D) of about 50 microns, and a ratio L/D of about 40. The graph shown in FIG. 2 shows that, the incorporation of the short brass fibers increases $\text{Re}(\epsilon)$ and $\text{Im}(\epsilon)$ to greatly vary electric characteristics.

This reason can be qualitatively explained as follows.

When a short metal fiber is placed in electromagnetic field, the metal fiber is polarized by the electric field component. Since the extent of polarization can be obtained by a product of the electric charge quantities separated at both ends of the short metal fiber and the length of the fiber, a thin long metal fiber is suitable for efficiently creating polarization. Where a plurality of metal short fibers irregularly present in the electro-magnetic field, an average polarization effect of respective fibers appears. Accordingly, an electro-magnetic wave absorbing material containing a plurality of short metal fibers can be equivalently considered as a material having a large polarization, thus making large the real part $\text{Re}(\epsilon)$ of the complex dielectric constant representing the magnitude of the polarization.

Where a plurality of layers of the electric wave absorbing material each having a thickness substantially equal to the wavelength of the electric wave are laminated for use in a microwave frequency band, the overall thickness of the lamination is in a range of from 0.1 to 50 mm. Preferably the length of the fibers is in a range of 0.1 to 50 mm. Since the fiber should have thin and elongated configuration, the ratio L/D should be larger than 10.

While in the foregoing, the real part $\text{Re}(\epsilon)$ of the complex dielectric constant has been described, it is considered that the imaginary part $\text{Im}(\epsilon)$ is influenced by the variation of the electric conductivity caused by the incorporation of the short metal fibers. More particularly, incorporation of the short metal fibers increases conductive current, hence electric loss, with the result that the imaginary part $\text{Im}(\epsilon)$ of the complex dielectric constant representing the loss increases. For this reason, for the purpose of efficiently increasing the imaginary part $\text{Im}(\epsilon)$ of the complex dielectric constant it is necessary to use short metal fibers made of metal or alloy having a large electric conductivity.

The characteristics shown in FIG. 2 can be reproduced at a high fidelity so long as the same type of short metal fibers are used. Where metals of different type or fibers having different dimensions are used it is necessary to clarify the relationship among the quantity of the short metal fibers incorporated, the real part $\text{Re}(\epsilon)$ and the imaginary part $\text{Im}(\epsilon)$ of the complex dielectric constant.

Figure 3:
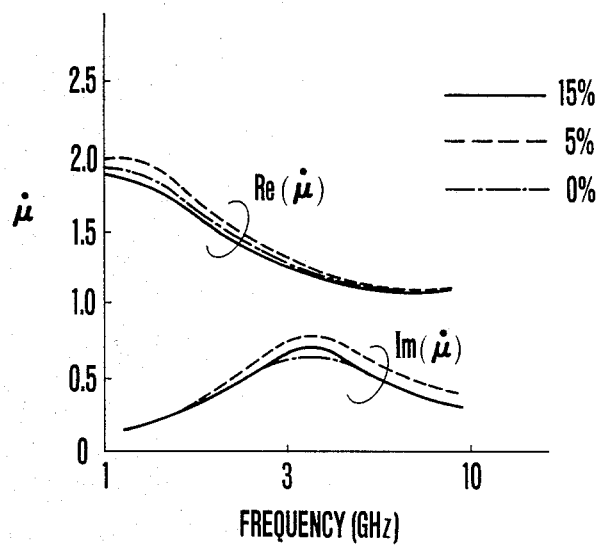
FIG. 3 is a graph showing the relationship among the quantity of short brass fibers and frequency characteristics of the complex permeability (Re($\mu$), Im ($\mu$))

The magnetic characteristic will be discussed as follows. Since the electro-magnetic wave absorbing material of this invention contains ferrite, it can manifest a magnetic loss. FIG. 3 shows the result of measurement of the complex dielectric constant (measured at a frequency of 1 GHz–10 GHz) of the electro-magnetic wave absorbing members respectively consisting of epoxide resin, 70% by weight of iron ferrite ($Fe_3O_4$) and 0%, 5% and 15% by weight of short brass fibers. Even when the quantity of incorporation of short brass fibers is varied in the range of 0–15% by weight, both the real part $\text{Re}(\mu)$ and the imaginary part $\text{Im}(\mu)$ of the dielectric constant do not vary in any appreciable extent. As above described, the magnetic characteristic of the material is never influenced by the incorporation of the short metal fibers and the magnetic characteristic is governed mainly by the magnetic characteristic of the ferrite.

As above described, since the electric wave absorption material according to this invention is incorporated with short metal fibers not only the electric characteristic can be greatly and stably adjusted but a magnetic loss can be also increased.

The type of the high molecular synthetic resin is not determined by the wave characteristic to be absorbed but rather determined by such environment conditions as weather proofness, heat resistant and shock resistant properties. In this invention, it is not necessary to use any specific resin, where the electro-magnetic wave absorbing material is applied by blasting, epoxy resin is preferred. However, when the material is applied onto a curved surface flexible rubber is advantageous.

The electro-magnetic wave absorbing material can be laminated to form an electro-magnetic wave absorbing body as shown in Japanese Laid Open Patent Specification No. 10902/1982. Moreover, since it has a large loss for the electric wave, it can be used as an electro-magnetic shield member.

Some embodiments of the electric wave absorbing body using the electro-magnetic wave absorbing material characterized by the present invention will be explained as follows.

Figure 4:
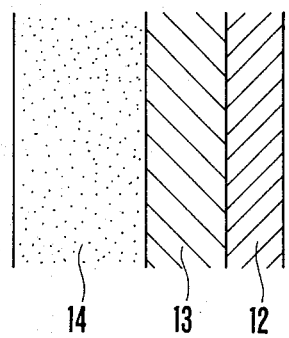
FIG. 4 is a partial sectional view showing a laminated electro-magnetic wave absorbing body embodying the invention.
Figure 5:
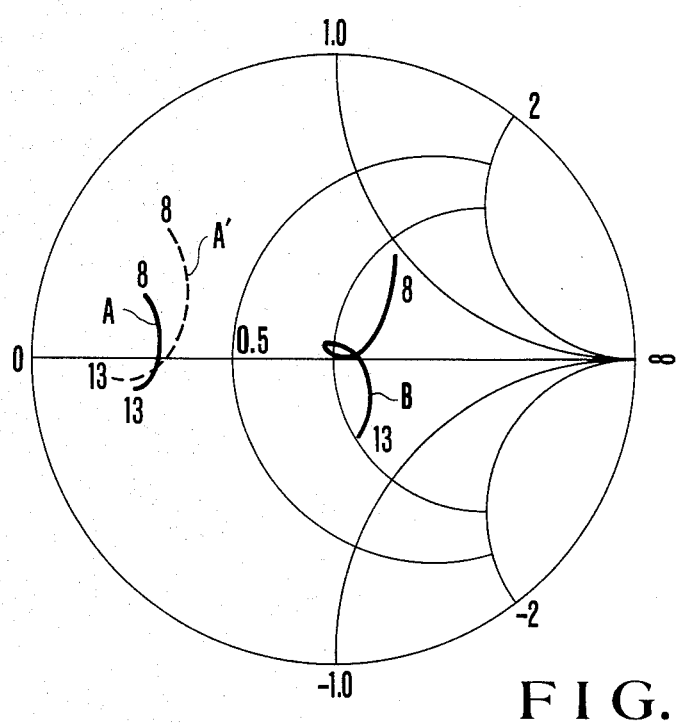
FIG. 5 is a Smith Chart showing an input impedance characteristic measured from above a low input impedance layer formed on a metal sheet and an input impedance characteristic measured from above an impedance transforming layer laminated on the low input impedance layer.
Figure 6:
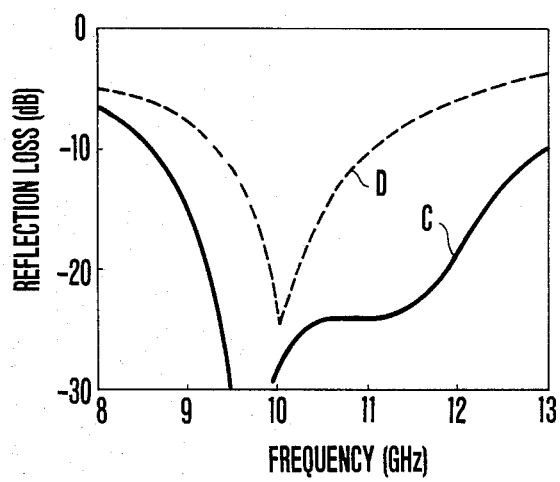
FIG. 6 shows a reflection loss characteristic obtained by converting characteristic B shown in FIG. 5, and a reflection loss characteristic of a prior art electro-magnetic wave absorbing body.

The electric wave absorbing body shown in FIG. 4 comprises a low input impedance layer 13 formed on an electro-conductive sheet or plate transforming layer 12 formed on the low input impedance layer 13. The electro-conductive plate 12 constitutes a conductor portion of the basic member to be coated with the electro-magnetic wave absorbing material. The term "low input impedance layer" means a layer having a characteristic wherein the input impedance characteristic is located near the left end of a Smith Chart as shown at A in FIG. 5. Although this layer 13 manifests a large loss for electric wave, when it is merely applied onto an electro-conductive sheet nearly all electric waves are reflected by the surface of the layer 13 thus failing to provide a satisfactory electro-magnetic wave absorbing body. According to this embodiment, for the purpose of efficiently transmit electromagnetic wave to the low input impedance layer 13, the impedance transforming layer 14 is provided as shown in FIG. 4 which operates in the same manner as a ¼ wavelength impedance transformer utilized in microwave technology so that the layer 14 is designed in the same manner as the ¼ wavelength impedance transformer. Let us denote by R the value of the real part at a frequency fo at which the imaginary part becomes zero. Then the impedance transforming layer 14 acts as an impedance transformer when the surge impedance of the layer 14 is made $Zw=\sqrt{R}$ and when the thickness of the layer 14 is made to be ¼ of the wavelength at the frequency fo. Ordinary materials have dielectric constants of larger than 2 and their surge impedance is expressed by $Zw=\sqrt{\mu/\epsilon}$. From the foregoing relation it can be understood that R must be less than 0.5. Where such impedance transforming layer 14 is provided the input impedance characteristic as seen from its surface becomes that shown by B in FIG. 5. When this characteristic is expressed in terms of reflection loss, a characteristic as shown by C in FIG. 6 can be obtained. Curve D shown in FIG. 6 is the characteristic of the prior art electro-magnetic wave abosrbing body without including short metal fibers characterized by the present invention. From the characteristics C and D shown in FIG. 6, it will be seen that, by utilizing the electro-magnetic wave absorbing material according to this invention, the frequency bandwidth in which the reflection loss becomes more than 20 dB is widened. In FIG. 5 numerals 8 and 13 show the characteristics at frequencies 8 GHz-13 GHz.

The low input impedance characteristic can also be improved by further adding a ferrodielectric substance for electro-conductive substance. Typical ferrodielectric substances include barium titanate, lead titanate, strontium titanate, lead neobate, and lead zirconate.

The electro-magnetic wave absorption characteristic of the electro-magnetic wave absorbing material of this invention is as follows.

In order to efficiently absorb electro-magnetic wave, it is essential to form the low impedance layer with the high molecular weight resin and material having a high electric conductivity as can be clearly understood from the foregoing description. We have found that it is necessary to incorporate into the low impedance layer magnetic substance that impart magnetic loss to the low impedance layer in order to realize an excellent electro-magnetic wave absorption characteristic over a wide frequency bandwidth.

Figure 7:
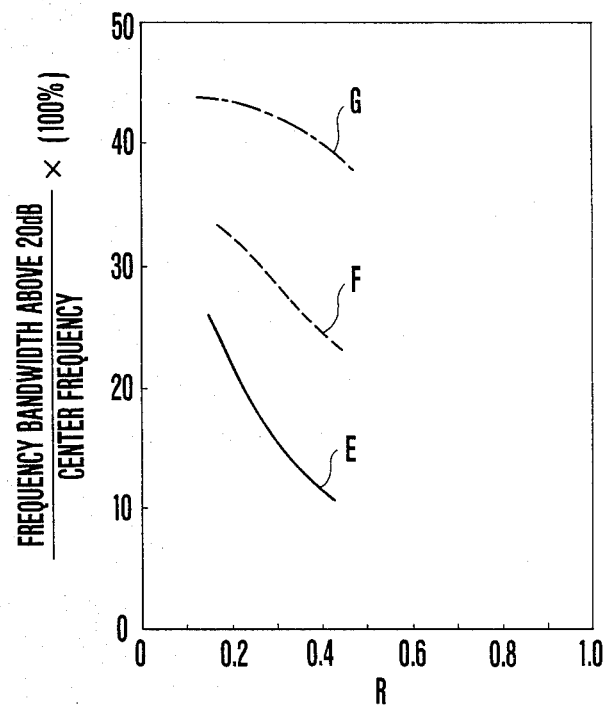
FIG. 7 is a graph comparing the frequency bandwidths of a low input impedance layer and an impedance transforming layer manifesting a magnetic loss.

Curve A shown in FIG. 5 shows the input impedance characteristic where there is a magnetic loss while curve A' shows the input impedance characteristic where there is no magnetic loss. In both characteristics A and A', the value R of the real part at a frequency at which the imaginary part becomes zero is about 0.3, but at a frequency of 8-13 GHz, the characteristics become different so that the electro-magnetic wave absorbing characteristics where the electro-magnetic wave abosrbing body is fabricated by laminating the impedance transforming layer 14 become also different. The results of calculations of the low input impedance transforming layers 13 incorporated with magnetic loss and not are shown by curves E and F in FIG. 7 which shows the relation between a value obtained by dividing a frequency bandwidth in which a reflection loss of more than 20 dB occurs with the center frequency of the bandwidth, and the input impedance R. As can be clearly noted by comparing characteristics E and F shown in FIG. 7 the characteristic F having magnetic loss has a wider frequency band characteristic. For this reason, it is desirable for the electro-magnetic wave absorbing body to incorporate magnetic loss in the low input impedance layer 13. In FIG. 7, the ralation of magnetic loss between the low impedance layer 13 and the impedance transforming layer 14 is follows.

| Curve | Magnetic loss of the low impedance layer 13 | Magnetic loss of the impedance transforming layer 14 |
|---|---|---|
| E | without | without |
| F | with | without |
| G | with | with |

Considering the impedance transforming layer 14, when the input impedance value of the low input impedance layer 13 is expressed by R its surge impedance must be $Zw=\sqrt{R}$. Consequently, depending upon the value of R even a high molecular resin itself may be used or for the purpose of fulfilling the conditions described above magnetic substance in the form of particles, foils or short fibers is incorporated into the high molecular synthetic resin. By combining the high molecular synthetic resin and the magnetic material an electro-magnetic wave absorbing body having desired impedance conversion capability and electric loss can be provided. As a result of various calculations, we have found that impartion of magnetic loss is effective to widen the frequency band. Characteristics F and G shown in FIG. 7 show this fact, in which characteristic G has a wider frequency bandwidth. Accordingly, in the electro-magnetic wave absorbing body of this invention it is desirable to impart magnetic loss to the impedance transforming layer 14. Magnetic loss can be imparted by incorporating the same material that imparts magnetic loss to the low input impedance.

Thermoplastic resins and thermosetting resins can be used as the high molecular synthetic resins utilized to form low input impedance layer 13 and the impedance transforming layer 14 and even when either one of these resins are used the same electric wave characteristic can be obtained. A flexible electro-magnetic wave absorbing body is easy to handle. To this end, natural or synthetic rubber can be used.

To have better understanding of this invention the following examples are given.

EXAMPLE 1

Figure 8:
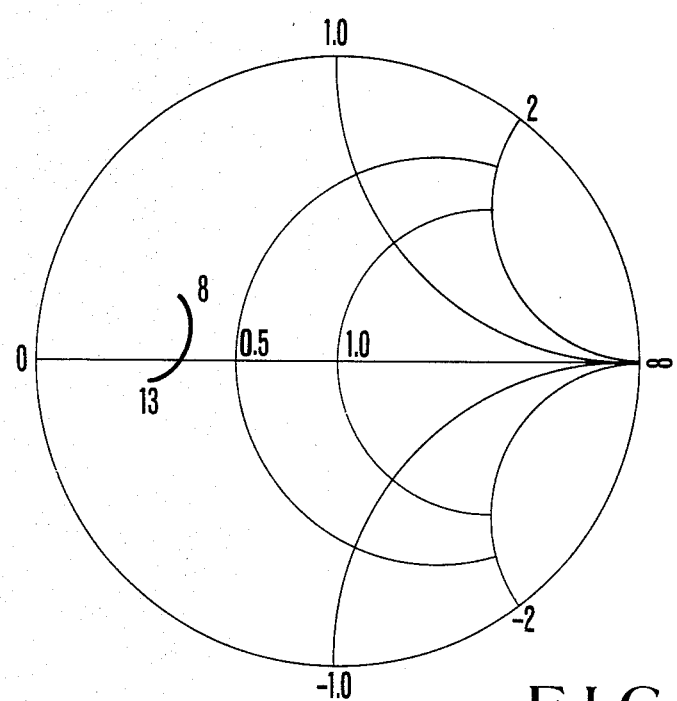
FIG. 8 and 9 show the input impedance characteristic and the reflection loss characteristic of only the low input impedance layer of the Example 1 to be described later.
Figure 9:
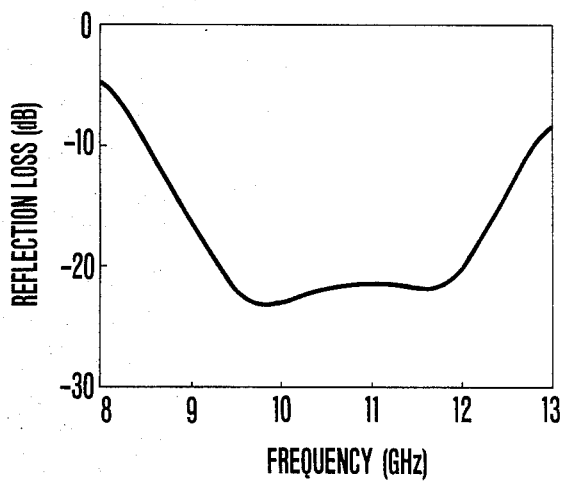

Polyethylene, ferrite and short brass fibers were mixed together at a weight ratio of 30:70:24, and a sheet of this mixture having a thickness of 1.0 mm was used as a low input impedance layer 13. A sheet having a thickness of 3.6 mm and containing polyethylene and ferrite at a weight ratio of 60:40 was used as an impedance transforming layer 14 to obtain an electro-magnetic wave absorbing body. FIG. 8 shows the input impedance characteristic of the low input impedance layer 13 alone, while FIG. 9 shows the reflection loss characteristic.

EXAMPLE 2

Figure 10:
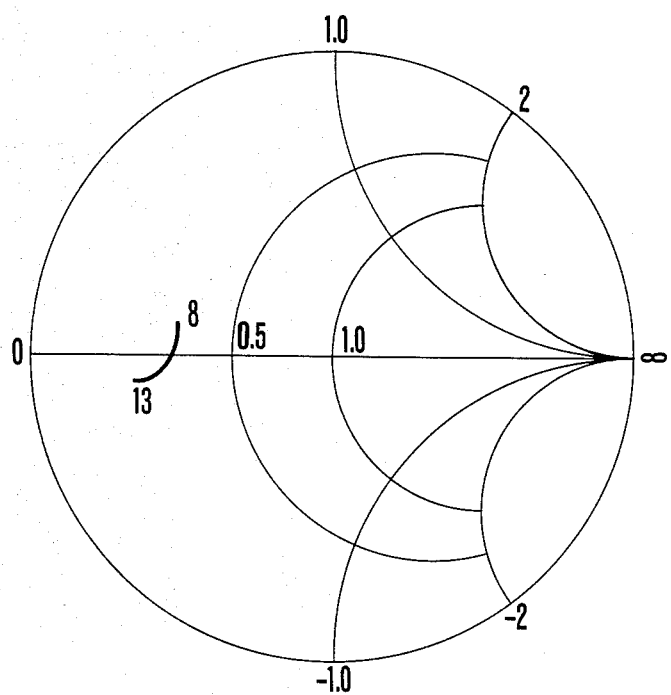
FIG. 10 and 11 show the input impedance characteristic and the reflection loss characteristic of only the low input impedance layer of Example 2.
Figure 11:
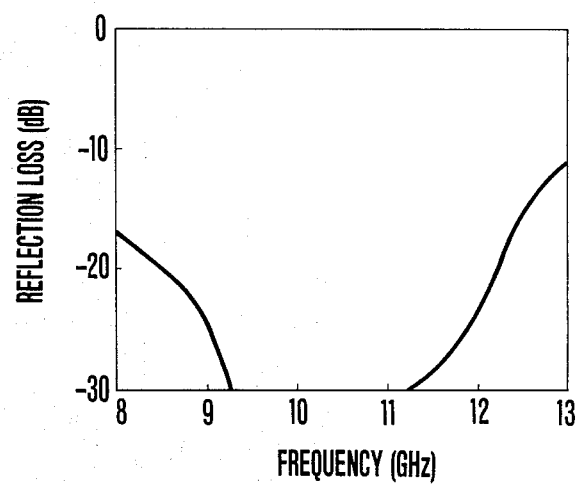

A polybutadiene resin, ferrite, and iron short fibers were admixed at a weight ratio of 30:70:15 and a sheet of this mixture having a thickness of 0.9 mm was used as the low input impedance layer 13. A sheet having a thickness of 3.8 mm and consisting of a mixture of polybutadiene resin, and ferrite at a ratio of 70:30 was used as the low impedance transforming layer 14 to form an electro-magnetic wave absorbing body. FIG. 10 shows the input impedance characteristic of the low input impedance layer 13 alone, while FIG. 11 shows the reflection loss characteristic.

EXAMPLE 3

Figure 12:
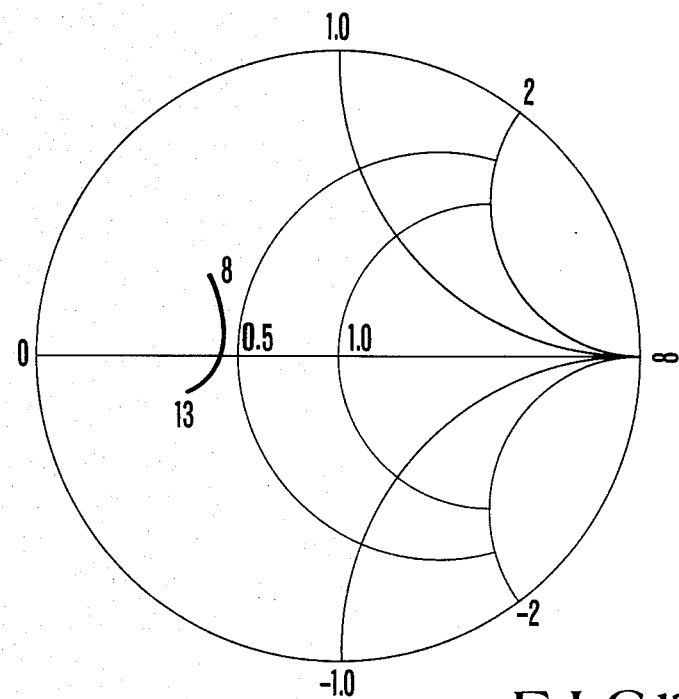
FIGS. 12 and 13 show the input impedance characteristic and the reflection loss characteristic of only the low input impedance layer of Example 3.
Figure 13:
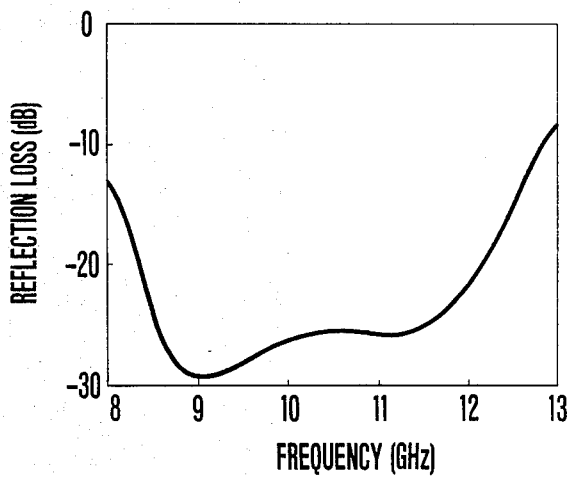

A polybutadiene resin and short iron fibers were mixed together at a weight ratio of 75:25 and the mixture was shaped into a sheet having a thickness of 1.4 mm. This sheet was used as a low input impedance layer 13 and a sheet of butadiene resin having a thickness of 4.6 mm was used as an impedance transforming layer 14 to form a electro-magnetic wave absorbing body. FIG. 12 shows the input impedance characteristic of the low input impedance layer 13 alone, while FIG. 13 the reflection loss characteristic.

EXAMPLE 4

Figure 14:
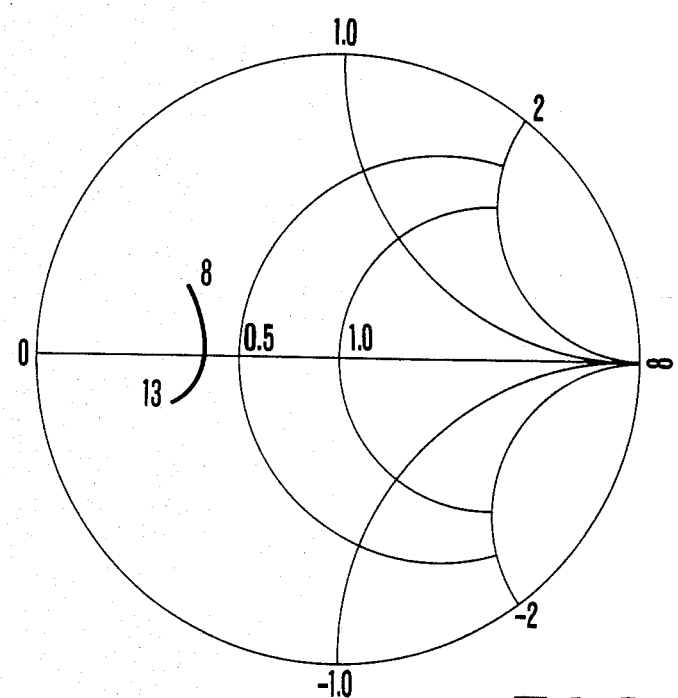
FIGS. 14 and 15 show the input impedance characteristic of the low input impedance layer alone and the reflection loss characteristic of Example 4.
Figure 15:
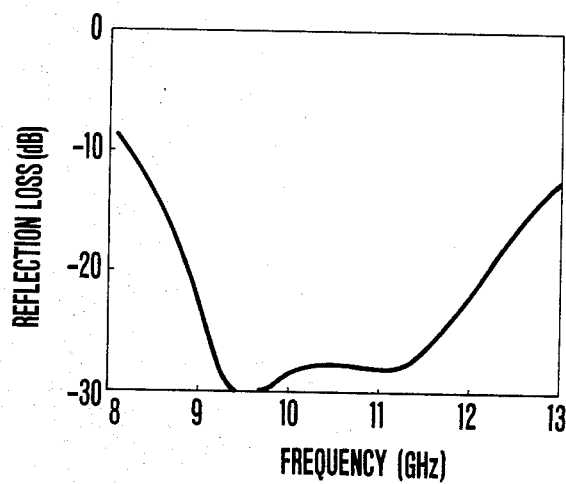

Chloroprene rubber, ferrite, carbon and short brass fibers were admixed at a weight ratio of 30:70:5:10 and the mixture was formed into a sheet having a thickness of 1.0 mm. This sheet was used as a low input impedance layer 13. A sheet having a thickness of about 3.6 mm and consisting of a mixture of chloroprene rubber, ferrite and carbon at a ratio of 70:30:5 was used as an impedance transforming layer 14 to obtain an electro-magnetic wave absorbing body. FIG. 14 shows the input impedance characteristic of the low input impedance layer 13 alone, and FIG. 15 shows a reflection loss characteristic.

As many apparently widely different embodiment of this invention may be made without departing from the spirit and scope thereof, it is to be understood that the invention is not limited to the specific embodiments thereof except as defined in the appended claims.

What is claimed is:

1. Electro-magnetic wave absorbing material comprising a mixture more than 3% by weight of short fibers of metal or alloy having a high electric conductivity selected from the group consisting of Au, Ag, Cu, Ae, Zn, Ni, Fe and alloys thereof, a length of 0.1 mm to 50 mm and a length to diameter ratio of larger than 10, a ferromagnetic material selected from the group consisting of ferrite, iron, cobalt and nickel and a high molecular synthetic resin which further comprises carbon black and a ferrodielectric substance selected from the group consisting of barium titanate, lead titanate, strontium titanate, lead neobate, and lead zirconate.

2. An electro-magnetic wave absorbing body comprising a low input impedance layer formed on a electro-conductive member, and an impedance transforming layer formed on said low input impedance layer, said low input impedance layer comprising a mixture of short fibers of metal or alloy having a high electric conductivity, a length of from 0.1 mm to 50 mm and a length to diameter ratio of larger than 10, a ferromagnetic material and a high molecular synthetic resin.

3. The electro-magnetic wave absorbing body according to claim 2 wherein said impedance transforming layer is made of a high molecular synthetic resin.

4. The electro-magnetic wave absorbing body according to claim 2 wherein said impedance transforming layer comprises a mixture of a high molecular synthetic resin and either one or both of a magnetic material and an electro-conductive material each in the form of particle, foils and short fibers.

5. The electro-magnetic wave absorbing member according to claim 4 wherein said magnetic material comprises a ferromagnetic material selected from the group consisting of ferrite, iron, cobalt, nickel and mixtures thereof.

6. The electro-magnetic wave absorbing body according to claim 4 wherein said electro-conductive material comprises at least one of electro-conductive metal, alloys of metals and carbon.

* * * * *

UNITED STATES PATENT AND TRADEMARK OFFICE
CERTIFICATE OF CORRECTION

PATENT NO. : 4,538,151
DATED : August 27, 1985
INVENTOR(S) : Hatakeyama et al.

It is certified that error appears in the above-identified patent and that said Letters Patent is hereby corrected as shown below:

Col. 1, l. 45: change "$Z=\sqrt{\frac{\mu_2}{\varepsilon_2}} \tanh(j \frac{2\pi}{\lambda} \sqrt{\varepsilon_2 \mu_2} d)$" to $--\dot{Z}=\sqrt{\frac{\mu_2}{\dot{\varepsilon}_2}} \tanh(j \frac{2\pi}{\lambda}\sqrt{\dot{\varepsilon}_2 \mu_2} d)--$ Col. 5, l. 14: change "abosrbing" to --absorbing--

Col 5, l. 51: change "abosrbing" to --absorbing--

Col. 5, l. 66: change "ralation" to --relation--

Col. 5, l. 68: insert --as-- after "is"

Signed and Sealed this

Eleventh Day of March 1986

[SEAL]

Attest:

DONALD J. QUIGG

Attesting Officer

Commissioner of Patents and Trademarks